US010912983B2

(12) United States Patent
Bostick et al.

(10) Patent No.: US 10,912,983 B2
(45) Date of Patent: Feb. 9, 2021

(54) HOLOGRAPHIC IMAGE SIMULATION

(71) Applicant: INTERNATIONAL BUSINESS MACHINES CORPORATION, Armonk, NY (US)

(72) Inventors: James E. Bostick, Cedar Park, TX (US); John M. Ganci, Jr., Raleigh, NC (US); Martin G. Keen, Cary, NC (US); Brian O'Connell, Wake, NC (US)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 16/014,003

(22) Filed: Jun. 21, 2018

(65) Prior Publication Data

US 2019/0388765 A1    Dec. 26, 2019

(51) Int. Cl.
*A63B 69/00* (2006.01)
*A63B 71/06* (2006.01)
(Continued)

(52) U.S. Cl.
CPC ........ *A63B 71/0622* (2013.01); *A63B 69/002* (2013.01); *G03H 1/0005* (2013.01); *G06F 16/40* (2019.01); *G06F 30/20* (2020.01); *G06T 7/20* (2013.01); *G09B 9/00* (2013.01); *A63B 2071/0636* (2013.01); *A63B 2071/0638* (2013.01); *A63B 2102/18* (2015.10); *A63B 2102/22* (2015.10); *A63B 2102/24* (2015.10); *A63B 2220/75* (2013.01); *A63B 2220/802* (2013.01); *A63B 2220/805* (2013.01); *A63B 2220/806* (2013.01); *A63B 2220/808* (2013.01); *A63B 2220/836* (2013.01);
(Continued)

(58) Field of Classification Search
None
See application file for complete search history.

(56) References Cited

U.S. PATENT DOCUMENTS

2011/0172060 A1    7/2011  Morales et al.
2015/0131845 A1*   5/2015  Forouhar ............... G06F 16/71
                                                            382/100
(Continued)

FOREIGN PATENT DOCUMENTS

WO         2016116780         7/2016

*Primary Examiner* — Bruk A Gebremichael
(74) *Attorney, Agent, or Firm* — Schmeiser, Olsen & Watts; James Nock (57) ABSTRACT

A method and system for improving holographic image simulation and presentation is provided. The method includes receiving and analyzing audio and video data associated with historical tendencies of an opponent sporting team occurring during previous sporting contests involving the opponent sporting team. Predicted tendencies of the opponent sporting team are determined with respect to a future sporting contest scheduled with a first sporting team. In response, a holographic simulation presentation is generated. The holographic simulation presentation is associated with a predicted performance of players of the opponent sporting team with respect to the future sporting contest scheduled with the first sporting team. The holographic simulation presentation is presented such that players of the first sporting team interact with holographic images of the players of the opponent sporting team during a practice session.

17 Claims, 7 Drawing Sheets

(51) Int. Cl.
  *G06T 7/20*      (2017.01)
  *G09B 9/00*      (2006.01)
  *G03H 1/00*      (2006.01)
  *G06F 16/40*     (2019.01)
  *G06F 30/20*     (2020.01)
  *A63B 102/18*    (2015.01)
  *A63B 102/22*    (2015.01)
  *A63B 102/24*    (2015.01)

(52) U.S. Cl.
  CPC ....... *A63B 2225/50* (2013.01); *A63B 2230/06* (2013.01); *A63B 2230/30* (2013.01); *A63B 2230/50* (2013.01); *A63B 2243/007* (2013.01); *A63B 2243/0025* (2013.01); *A63B 2243/0037* (2013.01); *A63B 2244/20* (2013.01); *G03H 2001/0088* (2013.01); *G03H 2210/56* (2013.01); *G03H 2210/62* (2013.01); *G06T 2207/10016* (2013.01); *G06T 2207/20076* (2013.01); *G06T 2207/20081* (2013.01); *G06T 2207/30221* (2013.01)

(56) References Cited

U.S. PATENT DOCUMENTS

2017/0113114 A1    4/2017   Nugent
2017/0291093 A1   10/2017   Janssen
2018/0015347 A1*   1/2018   Janssen .............. G09B 19/0038

* cited by examiner

HOLOGRAPHIC IMAGE SIMULATION

FIELD

The present invention relates generally to a method for generating a holographic image simulation and in particular to a method and associated system for improving holographic image technology associated with generating interactive holographic image simulation presentations for simulating game conditions for a scheduled sporting event.

BACKGROUND

Accurately presenting and simulating visual data typically includes an inaccurate process with little flexibility. Controlling and modifying visual data associated with surrounding conditions may include a complicated process that may be time consuming and require a large amount of resources. Accordingly, there exists a need in the art to overcome at least some of the deficiencies and limitations described herein above.

SUMMARY

A first aspect of the invention provides a holographic image simulation and presentation improvement method comprising: receiving, by a processor of a holographic image generation device, audio and video data associated with historical tendencies of an opponent sporting team occurring during a plurality of previous sporting contests involving the opponent sporting team; analyzing, by the processor, the historical tendencies and associated statistics; determining, by the processor based on results of the analyzing, predicted tendencies of the opponent sporting team with respect to a future sporting contest scheduled with a first sporting team; generating, by the processor based on the predicted tendencies, a holographic simulation presentation associated with a predicted performance of players of the opponent sporting team with respect to the future sporting contest scheduled with the first sporting team; and presenting, by the processor to the first sporting team during a practice session, the holographic simulation presentation such that players of the first sporting team interact with holographic images of the players of the opponent sporting team during the practice session.

A second aspect of the invention provides a computer program product, comprising a computer readable hardware storage device storing a computer readable program code, the computer readable program code comprising an algorithm that when executed by a processor of a holographic image generation device implements a holographic image simulation and presentation improvement method, the method comprising: receiving, by the processor, audio and video data associated with historical tendencies of an opponent sporting team occurring during a plurality of previous sporting contests involving the opponent sporting team; analyzing, by the processor, the historical tendencies and associated statistics; determining, by the processor based on results of the analyzing, predicted tendencies of the opponent sporting team with respect to a future sporting contest scheduled with a first sporting team; generating, by the processor based on the predicted tendencies, a holographic simulation presentation associated with a predicted performance of players of the opponent sporting team with respect to the future sporting contest scheduled with the first sporting team; and presenting, by the processor to the first sporting team during a practice session, the holographic simulation presentation such that players of the first sporting team interact with holographic images of the players of the opponent sporting team during the practice session.

A third aspect of the invention provides a holographic image generation device comprising a processor coupled to a computer-readable memory unit, the memory unit comprising instructions that when executed by the processor implements a holographic image simulation and presentation improvement method comprising: receiving, by the processor, audio and video data associated with historical tendencies of an opponent sporting team occurring during a plurality of previous sporting contests involving the opponent sporting team; analyzing, by the processor, the historical tendencies and associated statistics; determining, by the processor based on results of the analyzing, predicted tendencies of the opponent sporting team with respect to a future sporting contest scheduled with a first sporting team; generating, by the processor based on the predicted tendencies, a holographic simulation presentation associated with a predicted performance of players of the opponent sporting team with respect to the future sporting contest scheduled with the first sporting team; and presenting, by the processor to the first sporting team during a practice session, the holographic simulation presentation such that players of the first sporting team interact with holographic images of the players of the opponent sporting team during the practice session.

The present invention advantageously provides a simple method and associated system capable of accurately presenting visual data.

DETAILED DESCRIPTION

Figure 1:
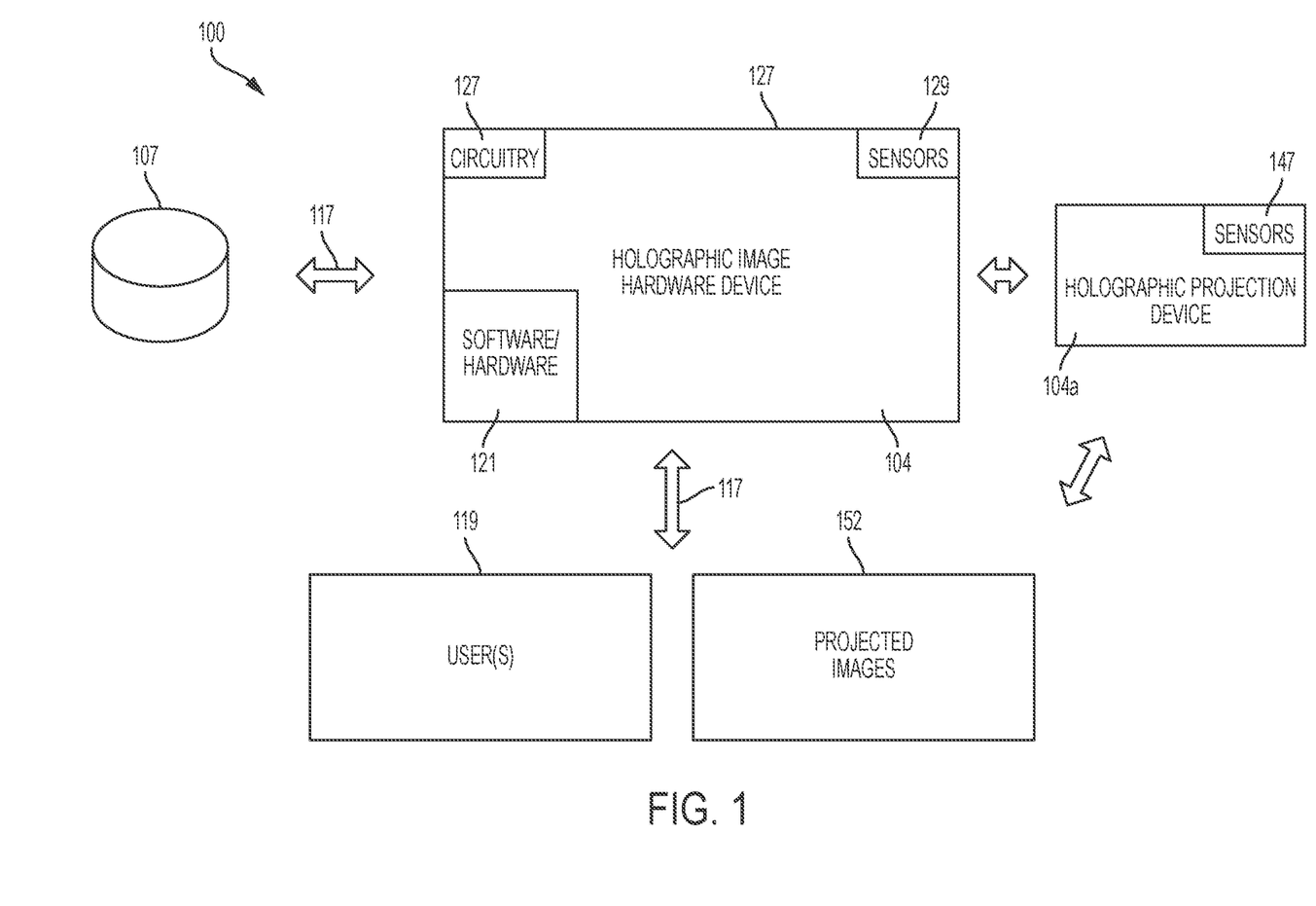
FIG. 1 illustrates a system for improving holographic image technology associated with generating interactive holographic image simulation presentations for simulating game conditions for a scheduled sporting event and generating resulting self-learning software code for executing future holographic image simulation presentations, in accordance with embodiments of the present invention.

FIG. 1 illustrates a holographic simulation system 100 for improving holographic image technology associated with generating interactive holographic image simulation presentations for simulating game conditions for a scheduled sporting event and generating resulting self-learning software code for executing future holographic image simulation presentations, in accordance with embodiments of the present invention. System 100 enables a holographic image hardware device 104 for dynamically and holographically simulating an opponent's actions during a sports training or practice session by:

1. Enabling holographic simulation system 100 to learn or read (in game) actions (via a process for analyzing stored/recorded video images) associated with an opponent with respect to a sporting contest. For example, actions may include, inter alia, tendencies, capabilities, playing style, etc.
2. Dynamically generating real-life size holographic images of (players of) the opponent for interacting with an actual person for simulating predicted real-time actions during the sports training session. The real-life/size holographic images and associated simulated actions are generated based on an analysis of historical movements (e.g., retrieved from database 107) of the opponent.

System 100 is enabled to simulate game time actions (for any type of sport including, inter alia, football, basketball, baseball, soccer, hockey, swimming, etc.) associated with a team's upcoming opponent via usage of holograms by analyzing images and historical data associated with past performances of both teams. In response, system 100 generates code for learning individual player tendencies and running a simulated opponent presentation via usage of real-sized holographic images. The real-sized holographic images will be programmed to win or lose associated one on one matchups with a real person randomly with respect to a same percentage of times as they normally would against a similar individual opponent. Therefore, a random result enables a player to learn to read progressions in real game situations as opposed to watching film thereby providing a technological advantage with respect to in game simulation technology. For example, system 100 enables an offensive team to prepare for an upcoming opponent by holographically simulating an opposing team player formation with respect to a movement of players such as, inter alia, simulated passing lanes, simulated running lanes, simulated receiver routes within a moving formation, etc. For example, with respect to an opponent offensive team that typically relies more on misdirection plays, system 100 may generate and present holograms that simulate more than one player appearing to have possession of the ball thereby enabling a practicing defensive player to read offensive keys and practice appropriately.

System 100 comprises hardware/software modules for providing the following functionality:
1. Executing an image analysis process for multiple teams and individuals with respect to historical data resulting in a code generation process for learning tendencies and probabilities of the multiple teams. The tendencies and probabilities are used to generate random holograms running a probabilistically correct set of plays against a practicing team.
2. Providing real-speed live action plays against an actual opposing team via generation of accurately sized holographic objects representing opposing team players performing game functions in real speed implementing typical in game plays. The holographic objects may include haptic feedback and may be projected from stationed holographic projectors or vehicles that move around and project the simulated holographic players.

System 100 of FIG. 1 includes a holographic image hardware device 104 (i.e., specialized hardware device), a holographic projection device(s) 104a, and a database 107 (e.g., a cloud based system) interconnected through a network 117. System 100 enables a process for generating and projecting holographic images 152 with respect to users 119 for simulating game conditions for a sporting event. Holographic image hardware device 104 includes specialized circuitry 127 (that may include specialized software), software code/hardware structure 121 (i.e., including self-learning software code), and sensors 129. Sensors 129 may include any type of internal or external sensor (or biometric sensor) including, inter alia, a heart rate monitor, a blood pressure monitor, a temperature sensor, a pulse rate monitor, an ultrasonic sensor, an optical sensor, a video retrieval device, an audio retrieval device, humidity sensors, ultrasonic transducers, etc. Holographic projection device 104a (including sensors 147) may include a stationary projection device or a mobile projection device including a vehicular projection device. A vehicular projection device may include any type of vehicle that does not require a human operator to be located within the vehicle such as, inter alia, a remote controlled vehicle (e.g., an aircraft flown by a pilot at a ground control station), an autonomously controlled vehicle (e.g., an aircraft controlled based on pre-programmed flight plans and may include an intelligence algorithm that would enable the vehicle to know it's location and self-determine a holographic projection location), a pre-programmed vehicle, etc. Alternatively, the vehicle may comprise any type of vehicle that includes a human operator located within the vehicle (e.g., an aircraft, an automobile, a boat or ship, a train, etc.). The vehicles may include, inter alia, an aerial vehicle, a land based vehicle, a marine (water) based vehicle, etc. Sensors 147 may include GPS sensors for directing the vehicle towards a specified geographical location. Holographic image hardware device 104, holographic projection device 104a, and database 107 may each may comprise an embedded device. An embedded device is defined herein as a dedicated device or computer comprising a combination of computer hardware and software (fixed in capability or programmable) specifically designed for executing a specialized function. Programmable embedded computers or devices may comprise specialized programming interfaces. In one embodiment, Holographic image hardware device 104, holographic projection device, and database 107 may each comprise a specialized hardware device comprising specialized (non-generic) hardware and circuitry (i.e., specialized discrete non-generic analog, digital, and logic based circuitry) for (independently or in combination) executing a process described with respect to FIGS. 1-7. The specialized discrete non-generic analog, digital, and logic based circuitry may include proprietary specially designed components (e.g., a specialized integrated circuit, such as for example an Application Specific Integrated Circuit (ASIC) designed for only implementing an automated process for improving holographic image technology associated with generating interactive holographic image simulation presentations for simulating game conditions for a scheduled sporting event and generating resulting self-learning software code for executing future holographic image simulation presentations. Network 117 may include any type of network including, inter alia, a local area network, (LAN), a wide area network (WAN), the Internet, a wireless network, etc. Alternatively, network 117 may include an application programming interface (API).

In accordance with embodiments of holographic projection device 104a that include a vehicular projection device, multiple vehicular projection devices may be enabled for projecting holograms (representing simulated players) such that each vehicular projection device is associated with a simulated player thereby allowing each simulated player to move and perform actions at an appropriate speed.

Figure 2:
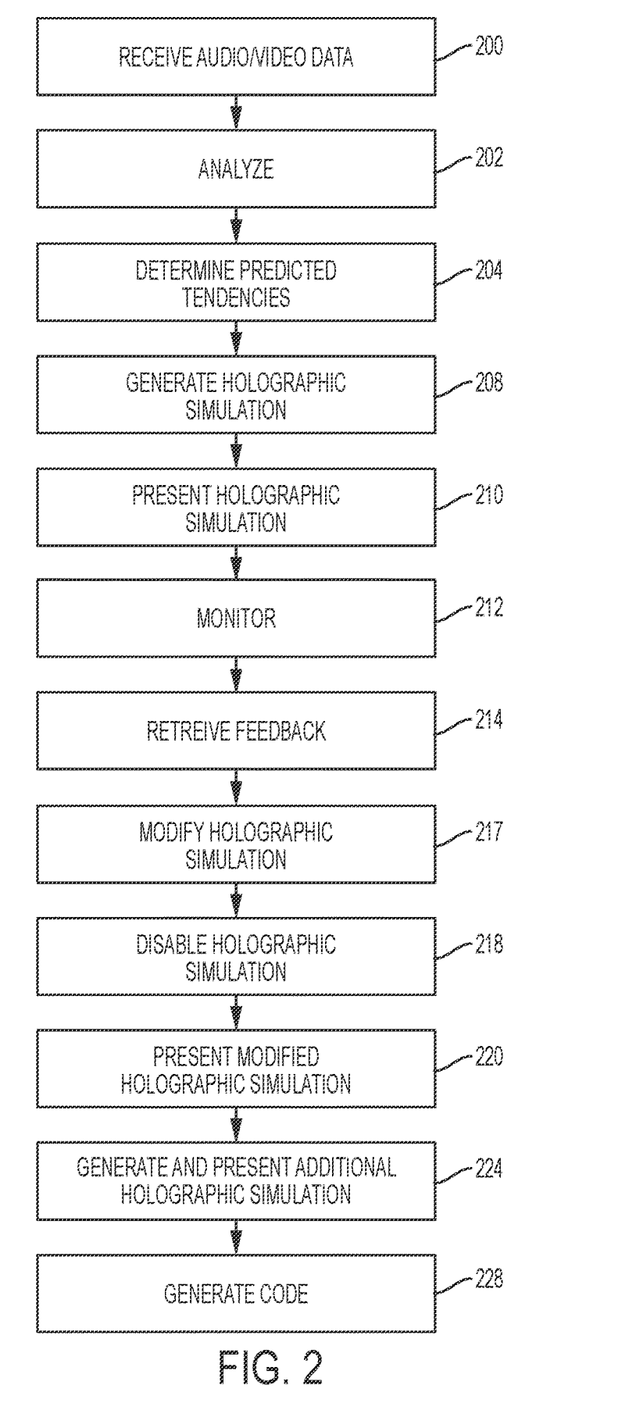
FIG. 2 illustrates an algorithm detailing a process flow enabled by the system of FIG. 1 for improving holographic image technology associated with generating interactive holographic image simulation presentations for simulating game conditions for a scheduled sporting event and generating resulting self-learning software code for executing future holographic image simulation presentations, in accordance with embodiments of the present invention.

FIG. 2 illustrates an algorithm detailing a process flow enabled by system 100 of FIG. 1 for improving holographic image technology associated with generating interactive holographic image simulation presentations for simulating game conditions for a scheduled sporting event and generating resulting self-learning software code for executing future holographic image simulation presentations, in accordance with embodiments of the present invention. Each of the steps in the algorithm of FIG. 2 may be enabled and executed in any order by a computer processor(s) executing computer code. Additionally, each of the steps in the algorithm of FIG. 2 may be enabled and executed in combination by holographic image hardware device 104, holographic projection device 104a, and database 107. In step 200, audio and video data associated with historical tendencies of an opponent sporting team occurring during a plurality of previous sporting contests involving the opponent sporting team is received by a holographic image generation device. In step 202, the historical tendencies and associated statistics are analyzed. In step 204, predicted tendencies of the opponent sporting team are determined (based on the analysis of step 202) with respect to a future sporting contest scheduled with a first sporting team. In step 208, a holographic simulation presentation is generated based on the predicted tendencies. The holographic simulation presentation is associated with a predicted performance of players of the opponent sporting team with respect to the schedule future sporting contest. In step 210, the holographic simulation presentation is presented to the first sporting team during a practice session. The holographic simulation presentation is presented such that players of the first sporting team interact with holographic images of the players of the opponent sporting team during the practice session. Presenting the holographic simulation presentation may include projecting the holographic images of the players of the opponent sporting team performing in game time conditions at a speed that is less than, greater than, or equal to a real-time speed occurring during an actual game. In step 212, the players of the first sporting team interacting with the holographic images are monitored via sensors of the holographic image generation device. In step 214, feedback data is retrieved from the sensors. The feedback data is associated with results of the monitoring. The feedback data may include, inter alia, biometric data or audio/video data associated with the players of the first sporting team interacting with the holographic images. In step 217, the holographic simulation presentation is modified (based on the feedback data) such that a modified holographic simulation presentation is generated. In step 218, the holographic simulation presentation is disabled. In step 220, the modified holographic simulation presentation is presented to the first sporting team during the practice session. The modified holographic simulation presentation is presented such that the players of the first sporting team interact with modified holographic images of the players of the opponent sporting team during the practice session. In step 224, an additional holographic simulation is generated and presented. The additional holographic simulation is associated with a predicted performance of the players of the first sporting team with respect to the future sporting contest scheduled with the opponent sporting team. The additional holographic simulation is presented in combination with the original or modified holographic simulation. In step 228, self-learning software code for executing future holographic simulation presentation processes is generated based on the holographic simulation presentation.

Figure 3:
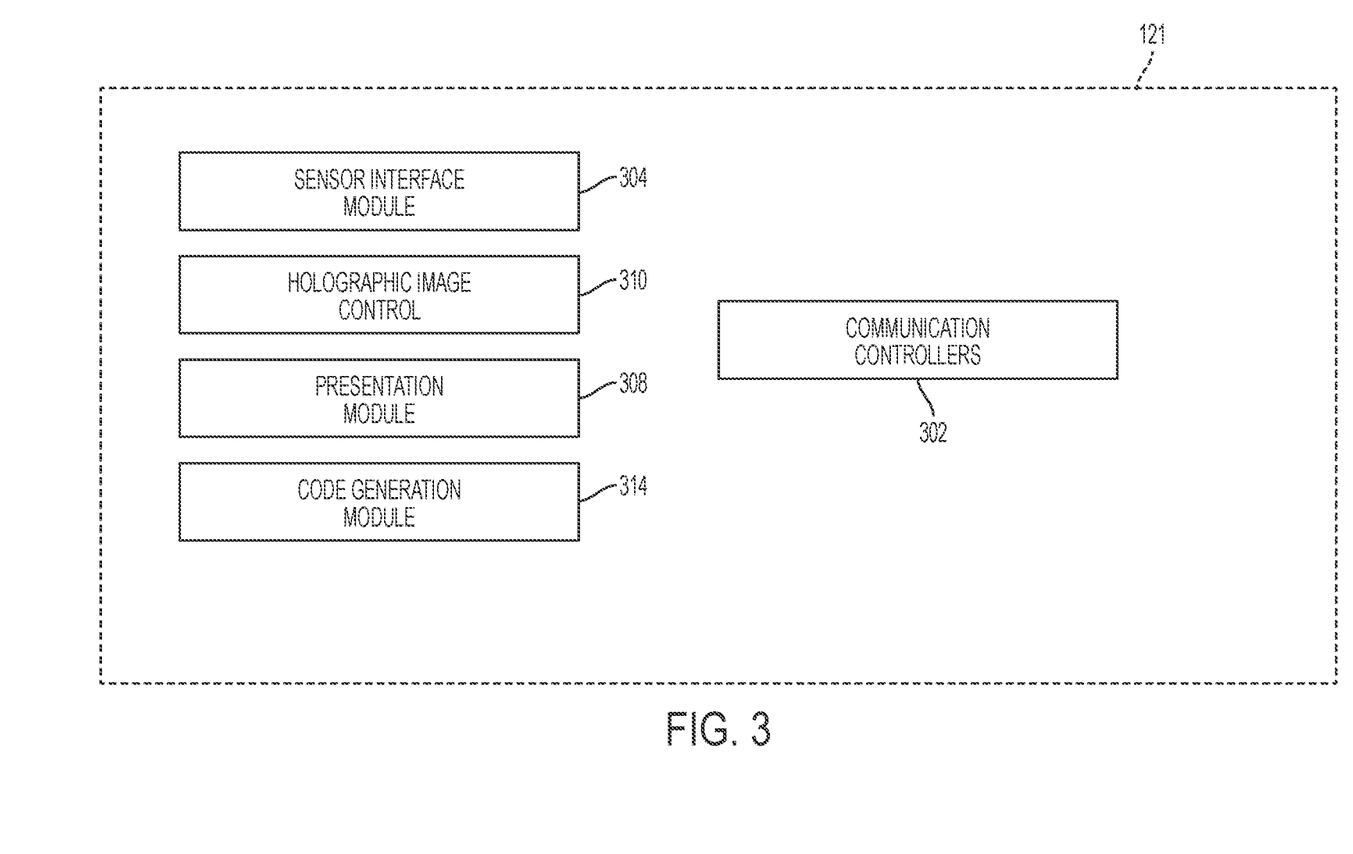
FIG. 3 illustrates an internal structural view of the software/hardware structure of FIG. 1, in accordance with embodiments of the present invention.

FIG. 3 illustrates an internal structural view of software/hardware structure 121 of FIG. 1, in accordance with embodiments of the present invention. Software/hardware structure 121 includes a sensor interface module 304, a holographic image control module 310, a presentation module 308, a code generation module 314, and communication controllers 302. Sensor interface module 304 comprises specialized hardware and software for controlling all functions related to sensors 129 and sensors 147 of FIG. 1. Holographic image control module 310 comprises specialized hardware and software for controlling all functionality related to generating specified holographic images as described with respect to the algorithm of FIG. 2. Presentation module 308 comprises specialized hardware and software for controlling all functions related to a holographic projector projecting specified holographic images as described with respect to the algorithm of FIG. 2. Code generation module 314 comprises specialized hardware and software for controlling all functions related to and generating self-learning software code for executing future holographic simulation processes. Communication controllers 302 are enabled for controlling all communications between sensor interface module 304, holographic image control module 310, presentation module 308, and code generation module 314.

Figure 4:
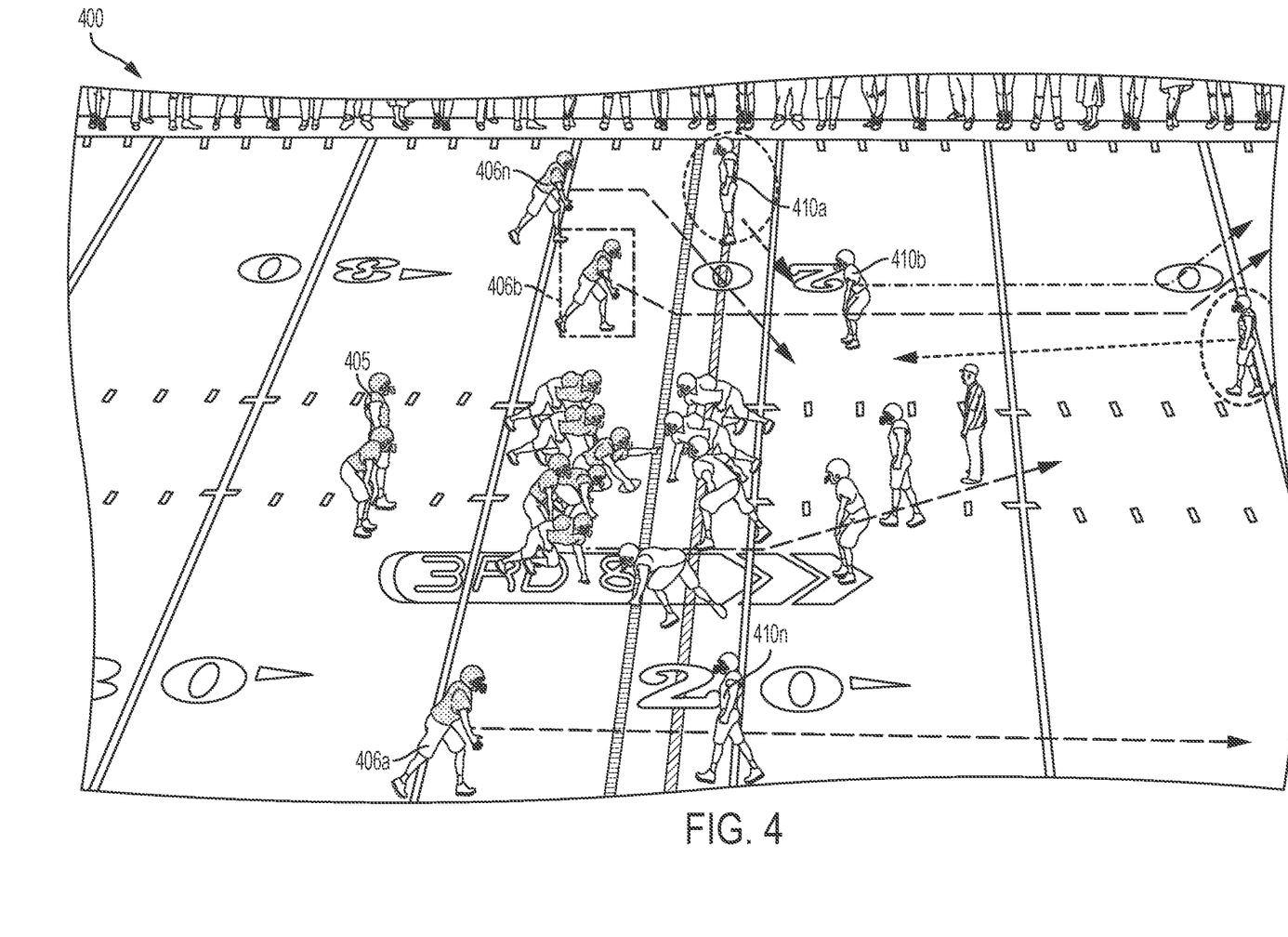
FIG. 4 illustrates an implementation example describing a process for presenting holographic images interacting with a real practicing player with respect to a football game, in accordance with embodiments of the present invention.

FIG. 4 illustrates an implementation example describing a process 400 for presenting holographic images 406a . . . 406n and/or holographic images 410a . . . 410n interacting with a real practicing player 405 with respect to a football game, in accordance with embodiments of the present invention. The example is initiated when opposing team tendencies are inputted (e.g., from prerecorded game video data) into the system for analysis. The tendencies are analyzed and associated statistics are tracked. For example, when an offensive team is lined up in an XYZ formation (e.g., 3 wide receivers such as holographic images 406a, 406b, and 406n) and a defensive team is lined up respectively (e.g., 3 defensive backs such as holographic images 410a, 410b, and 410n), then it may be determined that 54 percent of the time the defensive team will bring 5 pass rushers or 73 percent of the time, the defensive team will drop a middle linebacker into coverage. With respect to an individual player level, the system may automatically detect that when a certain player lines up outside of his typical position spot and feigns a pass rush and 42 percent of the time he is determined to be bluffing and will typically drop back to cover a tight end. Additionally, when a player walks to the line in a certain way, it could be indicative that he is going to rush the passer. Probabilities of success or failure with respect to a player A covering an A-rated receiver or player B covering a tight end may be additionally determined based on the aforementioned analysis. Results of the analysis are used to generate a holographic simulation for use during practice sessions. In the implementation example, receivers and quarterbacks must be able to read a defense and react. Therefore, the system is configured to generate and present a holographic simulation so that a quarterback (e.g., player 405) may virtually play against a defense (for a future opponent) associated with simulated defensive plays so that he may learn to react to real game situations. For example, when an offensive guard is beat by a defensive lineman, is the quarterback able to find his hot read and when he has time, does he go through his progressions to find open receiver, etc.?

The system is enabled to generate and project holographic images presenting all defensive players (e.g., holographic images 410a . . . 410n) for an upcoming opponent. Additional holographic images (e.g., holographic images 406a . . . 406n) or real players (e.g., real player 405) may represent an offensive practicing team. For example, process 400 illustrates a quarterback as a real practicing player 405 and all additional offensive and defensive players as holographic images 410a . . . 410n and 406a . . . 406n. Therefore, as a team lines up a certain way, a defense may be called by the system with respect to the determined statistics. A same play will not be run every time, but plays will be run in proportion to statistical calls. Holographic players will behave as they typically do when such a play is called (e.g., with respect to temperament and stance). Additionally, when a ball is snapped, all holograms will move in real speed such that each one on one battle between holograms is executed individually by the system and therefore play will develop at real speed enabling the quarterback to go through his progressions as he would in a real game.

Figure 5:
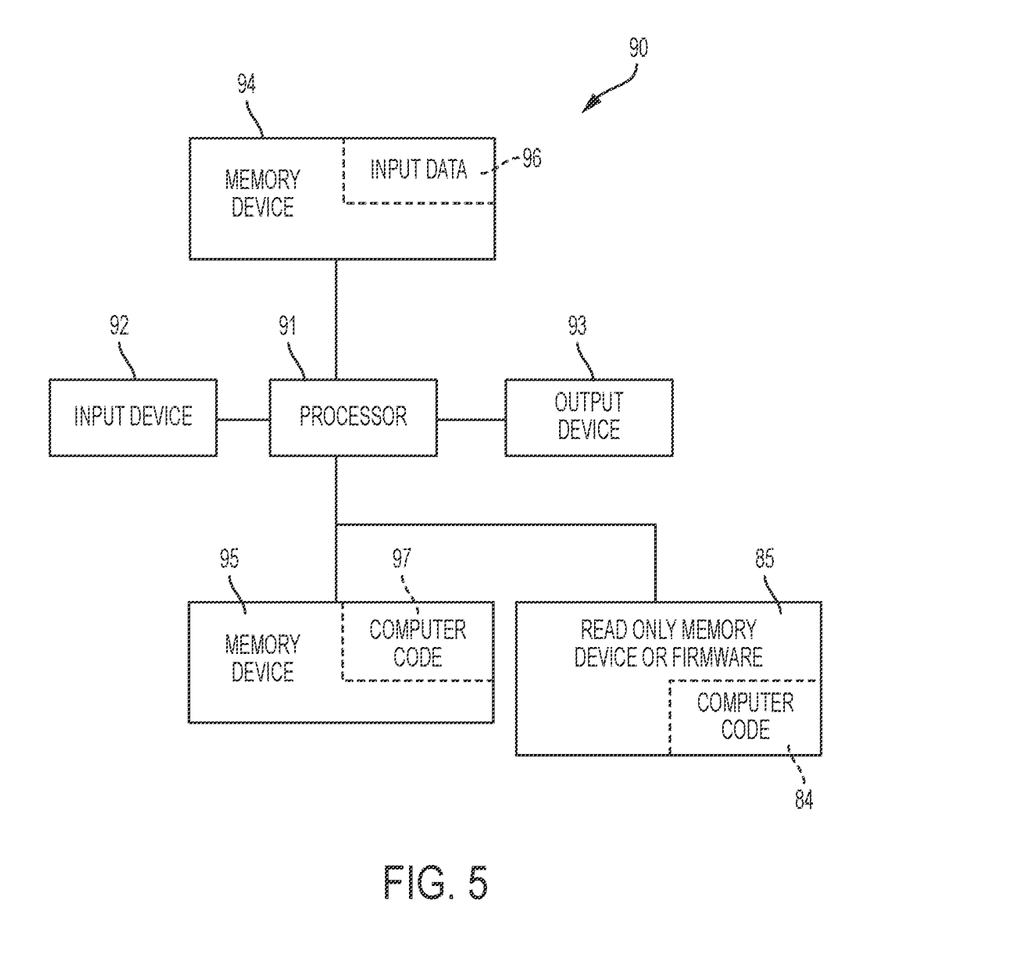
FIG. 5 illustrates a computer system used by the system of FIG. 1 for improving holographic image technology associated with generating interactive holographic image simulation presentations for simulating game conditions for a scheduled sporting event and generating resulting self-learning software code for executing future holographic image simulation presentations, in accordance with embodiments of the present invention.

FIG. 5 illustrates a computer system 90 (e.g., holographic image hardware device 104, holographic projection device 104a, and database 107 of FIG. 1) used by or comprised by the system of FIG. 1 for improving holographic image technology associated with generating interactive holographic image simulation presentations for simulating game conditions for a scheduled sporting event and generating resulting self-learning software code for executing future holographic image simulation presentations, in accordance with embodiments of the present invention.

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module," or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing apparatus receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, device (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing device to produce a machine, such that the instructions, which execute via the processor of the computer or other programmable data processing device, create means for implementing the functions/acts specified in the flowchart and/or block diagram block or blocks. These computer readable program instructions may also be stored in a computer readable storage medium that can direct a computer, a programmable data processing device, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing device, or other device to cause a series of operational steps to be performed on the computer, other programmable device or other device to produce a computer implemented process, such that the instructions which execute on the computer, other programmable device, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The computer system 90 illustrated in FIG. 4 includes a processor 91, an input device 92 coupled to the processor 91, an output device 93 coupled to the processor 91, and memory devices 94 and 95 each coupled to the processor 91. The input device 92 may be, inter alia, a keyboard, a mouse, a camera, a touchscreen, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random-access memory (DRAM), a read-only memory (ROM), etc. The memory device 95 includes a computer code 97. The computer code 97 includes algorithms (e.g., the algorithm of FIG. 2) for improving holographic image technology associated with generating interactive holographic image simulation presentations for simulating game conditions for a scheduled sporting event and generating resulting self-learning software code for executing future holographic image simulation presentations. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices Such as read only memory device 96) may include algorithms (e.g., the algorithm of FIG. 2) and may be used as a computer usable medium (or a computer readable medium or a program storage device) having a computer readable program code embodied therein and/or having other data stored therein, wherein the computer readable program code includes the computer code 97. Generally, a computer program product (or, alternatively, an article of manufacture) of the computer system 90 may include the computer usable medium (or the program storage device).

In some embodiments, rather than being stored and accessed from a hard drive, optical disc or other writeable, rewriteable, or removable hardware memory device 95, stored computer program code 84 (e.g., including algorithms) may be stored on a static, nonremovable, read-only storage medium such as a Read-Only Memory (ROM) device 85, or may be accessed by processor 91 directly from such a static, nonremovable, read-only medium 85. Similarly, in some embodiments, stored computer program code 97 may be stored as computer-readable firmware 85, or may be accessed by processor 91 directly from such firmware 85, rather than from a more dynamic or removable hardware data-storage device 95, such as a hard drive or optical disc.

Still yet, any of the components of the present invention could be created, integrated, hosted, maintained, deployed, managed, serviced, etc. by a service supplier who offers to improve holographic image technology associated with generating interactive holographic image simulation presentations for simulating game conditions for a scheduled sporting event and generating resulting self-learning software code for executing future holographic image simulation presentations. Thus, the present invention discloses a process for deploying, creating, integrating, hosting, maintaining, and/or integrating computing infrastructure, including integrating computer-readable code into the computer system 90, wherein the code in combination with the computer system 90 is capable of performing a method for enabling a process for improving holographic image technology associated with generating interactive holographic image simulation presentations for simulating game conditions for a scheduled sporting event and generating resulting self-learning software code for executing future holographic image simulation presentations. In another embodiment, the invention provides a business method that performs the process steps of the invention on a subscription, advertising, and/or fee basis. That is, a service supplier, such as a Solution Integrator, could offer to enable a process for improving holographic image technology associated with generating interactive holographic image simulation presentations for simulating game conditions for a scheduled sporting event and generating resulting self-learning software code for executing future holographic image simulation presentations. In this case, the service supplier can create, maintain, support, etc. a computer infrastructure that performs the process steps of the invention for one or more customers. In return, the service supplier can receive payment from the customer(s) under a subscription and/or fee agreement and/or the service supplier can receive payment from the sale of advertising content to one or more third parties.

While FIG. 5 shows the computer system 90 as a configuration of hardware and software, any configuration of hardware and software, as would be known to a person of ordinary skill in the art, may be utilized for the purposes stated supra in conjunction with the computer system 90 of FIG. 5. For example, the memory devices 94 and 95 may be portions of a single memory device rather than separate memory devices.

Cloud Computing Environment

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 6:
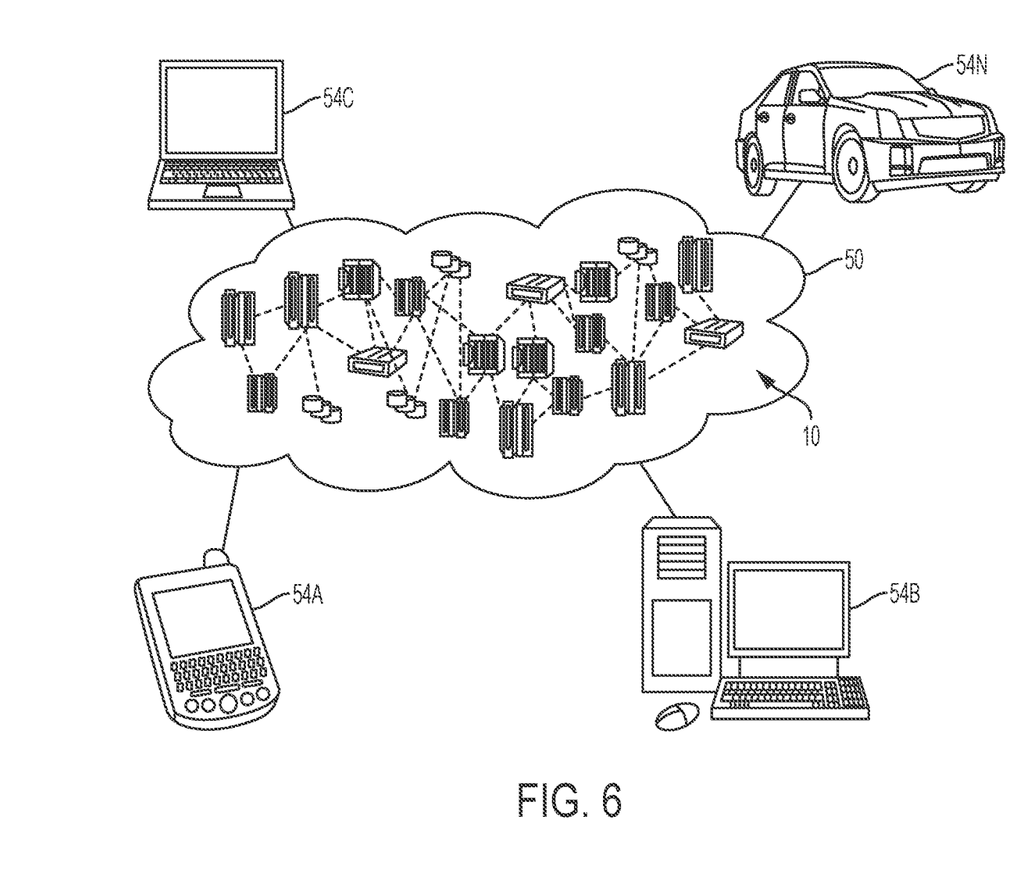
FIG. 6 illustrates a cloud computing environment, in accordance with embodiments of the present invention.

Referring now to FIG. 6, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A, 54B, 54C and 54N shown in FIG. 6 are intended to be illustrative only and that computing nodes 10 and cloud computing environment 50 can communicate with any type of computerized device over any type of network and/or network addressable connection (e.g., using a web browser).

Figure 7:
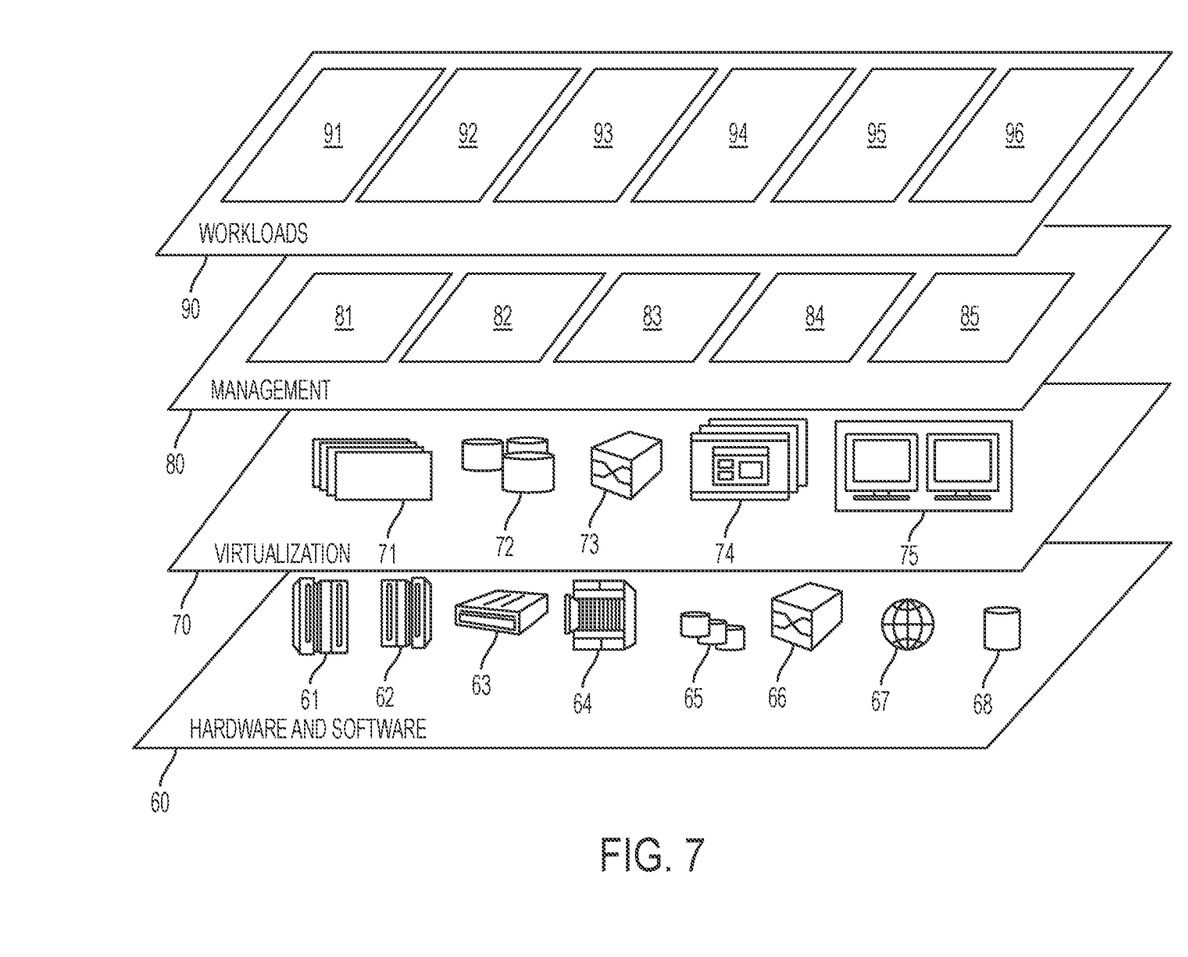
FIG. 7 illustrates a set of functional abstraction layers provided by cloud computing environment, in accordance with embodiments of the present invention.

Referring now to FIG. 7, a set of functional abstraction layers provided by cloud computing environment 50 (see FIG. 6) is shown. It should be understood in advance that the components, layers, and functions shown in FIG. 7 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 89 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and for improving display generation and presentation technology associated with analyzing multiple video streams for presenting specified viewable data, retrieving associated feedback, and generating resulting self-learning software code for executing future holographic image simulation presentations 96.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A holographic image simulation and presentation improvement method comprising:
   receiving, by a processor of a holographic image generation device, audio and video data associated with historical tendencies of an opponent sporting team occurring during a plurality of previous sporting contests involving said opponent sporting team;
   analyzing, by said processor, said historical tendencies and associated statistics;
   determining, by said processor based on results of said analyzing, predicted tendencies of said opponent sporting team with respect to a future sporting contest scheduled with a first sporting team;
   generating, by said processor based on said predicted tendencies, a holographic simulation presentation associated with a predicted performance of players of said opponent sporting team with respect to said future sporting contest scheduled with said first sporting team;
   presenting, by said processor to said first sporting team during a practice session, said holographic simulation presentation such that players of said first sporting team interact with holographic images of said players of said opponent sporting team during said practice session;
   monitoring, by said processor via sensors of said holographic image generation device, said players of said first sporting team interacting with said holographic images;
   retrieving, by said processor from said sensors, feedback data associated with results of said monitoring;
   modifying, by said processor based on said feedback data, said holographic simulation presentation such that a modified holographic simulation presentation is generated;
   disabling, by said processor in response to said modifying, said holographic simulation presentation; and
   presenting, by said processor to said first sporting team during said practice session, said modified holographic simulation presentation such that said players of said first sporting team interact with modified holographic images of said players of said opponent sporting team during said practice session.

2. The method of claim 1, wherein said feedback data comprises biometric data retrieved, via a plurality of biometric sensors, from said players of said first sporting team interacting with said holographic images.

3. The method of claim 1, wherein said feedback data comprises audio and video data retrieved, via a plurality of audio/video retrieval devices, from said players of said first sporting team interacting with said holographic images.

4. The method of claim 1, further comprising:
   receiving, by said processor, additional audio and video data associated with historical tendencies of said first sporting team occurring during a plurality of sporting contests involving said first sporting team;
   additionally analyzing, by said processor, said historical tendencies and associated statistics of said first sporting team;
   determining, by said processor based on results of said additionally analyzing, predicted tendencies of said first sporting team;
   generating, by said processor based on said predicted tendencies of said first sporting team, an additional holographic simulation presentation associated with a predicted performance of said players of said first sporting team with respect to said future sporting contest scheduled with said opponent sporting team; and
   presenting, by said processor to said first sporting team during said practice session, said additional holographic simulation presentation in combination with said holographic simulation presentation such that holographic images of said players of said first sporting team interact with holographic images of said players of said opponent sporting team during said practice session.

5. The method of claim 1, further comprising:
   generating, by said processor based on said holographic simulation presentation, self-learning software code for executing future holographic simulation presentation processes.

6. The method of claim 1, wherein said presenting said holographic simulation presentation comprises projecting said holographic images of said players of said opponent sporting team performing in game time conditions at a speed that is less than a real time speed occurring during an actual game.

7. The method of claim 1, wherein said presenting said holographic simulation presentation comprises projecting said holographic images of said players of said opponent sporting team performing in game time conditions at a speed that is greater than a real-time speed occurring during an actual game.

8. The method of claim 1, further comprising:
providing at least one support service for at least one of creating, integrating, hosting, maintaining, and deploying computer-readable code in the holographic image generation device, said code being executed by the computer processor to implement: said receiving, said analyzing, said determining, said generating, and said presenting.

9. A computer program product, comprising a computer readable hardware storage device storing a computer readable program code, said computer readable program code comprising an algorithm that when executed by a processor of a holographic image generation device implements a holographic image simulation and presentation improvement method, said method comprising:
receiving, by said processor, audio and video data associated with historical tendencies of an opponent sporting team occurring during a plurality of previous sporting contests involving said opponent sporting team;
analyzing, by said processor, said historical tendencies and associated statistics;
determining, by said processor based on results of said analyzing, predicted tendencies of said opponent sporting team with respect to a future sporting contest scheduled with a first sporting team;
generating, by said processor based on said predicted tendencies, a holographic simulation presentation associated with a predicted performance of players of said opponent sporting team with respect to said future sporting contest scheduled with said first sporting team;
presenting, by said processor to said first sporting team during a practice session, said holographic simulation presentation such that players of said first sporting team interact with holographic images of said players of said opponent sporting team during said practice session;
monitoring, by said processor via sensors of said holographic image generation device, said players of said first sporting team interacting with said holographic images;
retrieving, by said processor from said sensors, feedback data associated with results of said monitoring;
modifying, by said processor based on said feedback data, said holographic simulation presentation such that a modified holographic simulation presentation is generated;
disabling, by said processor in response to said modifying, said holographic simulation presentation; and
presenting, by said processor to said first sporting team during said practice session, said modified holographic simulation presentation such that said players of said first sporting team interact with modified holographic images of said players of said opponent sporting team during said practice session.

10. The computer program product of claim 9, wherein said feedback data comprises biometric data retrieved, via a plurality of biometric sensors, from said players of said first sporting team interacting with said holographic images.

11. The computer program product of claim 9, wherein said feedback data comprises audio and video data retrieved, via a plurality of audio/video retrieval devices, from said players of said first sporting team interacting with said holographic images.

12. The computer program product of claim 9, wherein said method further comprises:
receiving, by said processor, additional audio and video data associated with historical tendencies of said first sporting team occurring during a plurality of sporting contests involving said first sporting team;
additionally analyzing, by said processor, said historical tendencies and associated statistics of said first sporting team;
determining, by said processor based on results of said additionally analyzing, predicted tendencies of said first sporting team;
generating, by said processor based on said predicted tendencies of said first sporting team, an additional holographic simulation presentation associated with a predicted performance of said players of said first sporting team with respect to said future sporting contest scheduled with said opponent sporting team; and
presenting, by said processor to said first sporting team during said practice session, said additional holographic simulation presentation in combination with said holographic simulation presentation such that holographic images of said players of said first sporting team interact with holographic images of said players of said opponent sporting team during said practice session.

13. The computer program product of claim 9, wherein said method further comprises:
generating, by said processor based on said holographic simulation presentation, self-learning software code for executing future holographic simulation presentation processes.

14. The computer program product of claim 9, wherein said presenting said holographic simulation presentation comprises projecting said holographic images of said players of said opponent sporting team performing in game time conditions at a speed that is less than a real-time speed occurring during an actual game.

15. The computer program product of claim 9, wherein said presenting said holographic simulation presentation comprises projecting said holographic images of said players of said opponent sporting team performing in game time conditions at a speed that is greater than a real-time speed occurring during an actual game.

16. The computer program product of claim 9, wherein said presenting said holographic simulation presentation comprises projecting said holographic images of said players of said opponent sporting team performing in game time conditions at a speed that equal to a real-time speed occurring during an actual game.

17. A holographic image generation device comprising a processor coupled to a computer-readable memory unit, said memory unit comprising instructions that when executed by the processor implements a holographic image simulation and presentation improvement method comprising:
receiving, by said processor, audio and video data associated with historical tendencies of an opponent sporting team occurring during a plurality of previous sporting contests involving said opponent sporting team;
analyzing, by said processor, said historical tendencies and associated statistics;
determining, by said processor based on results of said analyzing, predicted tendencies of said opponent sporting team with respect to a future sporting contest scheduled with a first sporting team;
generating, by said processor based on said predicted tendencies, a holographic simulation presentation associated with a predicted performance of players of said opponent sporting team with respect to said future sporting contest scheduled with said first sporting team;

presenting, by said processor to said first sporting team during a practice session, said holographic simulation presentation such that players of said first sporting team interact with holographic images of said players of said opponent sporting team during said practice session;

monitoring, by said processor via sensors of said holographic image generation device, said players of said first sporting team interacting with said holographic images;

retrieving, by said processor from said sensors, feedback data associated with results of said monitoring;

modifying, by said processor based on said feedback data, said holographic simulation presentation such that a modified holographic simulation presentation is generated;

disabling, by said processor in response to said modifying, said holographic simulation presentation; and presenting, by said processor to said first sporting team during said practice session, said modified holographic simulation presentation such that said players of said first sporting team interact with modified holographic images of said players of said opponent sporting team during said practice session.

* * * * *